(12) United States Patent
Felgueroso et al.

(10) Patent No.: US 6,858,798 B2
(45) Date of Patent: Feb. 22, 2005

(54) HOUSING PART FOR AN ELECTRICAL ADJUSTING DRIVE

(75) Inventors: Inigo Felgueroso, Buehl (DE); Wilfried Merkel, Kappelrodeck (DE); Gerard Albrecht, Hatten (FR); Roland Bohn, Buehl (DE); Rudolf Gmuend, Rastatt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/333,182

(22) PCT Filed: Jan. 25, 2002

(86) PCT No.: PCT/DE02/00248
§ 371 (c)(1),
(2), (4) Date: Jan. 16, 2003

(87) PCT Pub. No.: WO02/103884
PCT Pub. Date: Dec. 27, 2002

(65) Prior Publication Data
US 2004/0033724 A1 Feb. 19, 2004

(30) Foreign Application Priority Data
Jun. 16, 2001 (DE) .......................................... 101 29 118

(51) Int. Cl.[7] ................................................ H02G 3/08
(52) U.S. Cl. .............................. 174/50; 174/58; 174/60; 220/3.8; 220/4.02
(58) Field of Search ................................. 174/50, 17 R, 174/58, 60; 220/3.8, 4.02; 248/906; 439/535

(56) References Cited

U.S. PATENT DOCUMENTS

| | | | | |
|---|---|---|---|---|
| 4,591,957 A | * | 5/1986 | Harwood | 362/148 |
| 4,593,220 A | | 6/1986 | Cousins | |
| 4,654,694 A | * | 3/1987 | Val | 257/665 |
| 5,521,785 A | | 5/1996 | Schmidt et al. | |
| 5,762,579 A | | 6/1998 | Torii et al. | |
| 6,195,244 B1 | * | 2/2001 | Barz | 361/111 |

FOREIGN PATENT DOCUMENTS

| | | |
|---|---|---|
| DE | 197 02 833 A1 | 10/1997 |
| EP | 0 639 884 B1 | 5/2000 |
| EP | 1 075 076 A | 2/2001 |
| FR | 2 797 110 A | 2/2001 |
| JP | 09106870 | * 12/1995 |

OTHER PUBLICATIONS

Patent Abstracts of Japan vol. 1997, Publication Date Apr. 22, 1997.

* cited by examiner

*Primary Examiner*—Dhiru R Patel
(74) *Attorney, Agent, or Firm*—Michael J. Striker

(57) ABSTRACT

In the case of a housing part according to the related art, it is still necessary to assembly many components using additional assembly steps. They includes a connector and a brush holder, for example. A housing part (1) designed according to the invention includes a brush holder (36) and mounting feet (33) that are designed integral with the housing part (1), so that further assembly steps are eliminated.

16 Claims, 3 Drawing Sheets

HOUSING PART FOR AN ELECTRICAL ADJUSTING DRIVE

BACKGROUND OF THE INVENTION

The invention is based on a housing part for an electrical adjusting drive.

The act of applying a plastic coating to a pressed screen by means of injection molding is made known EP 0 639 884 B1 and U.S. Pat. No. 5,521,785, whereby housing parts for an electric motor are mounted on the plastic coating.

DE 197 02 833 A1 and U.S. Pat. No. 5,762,579 show a gearbox housing cover on which a pressed screen comprising sliding contacts is located.

SUMMARY OF THE INVENTION

In contrast, the housing part according to the invention has the advantage that many components of an electrical adjusting drive are simply and easily integrated on the housing part, thereby reducing the assembly times and the number of parts to be assembled.

Advantageous further developments and improvements of the housing part named in claim 1 are made possible by the measures listed in the dependent claims.

A pressed screen is advantageously used for the internal conductor tracks or the external conductor tracks, because they are easy to produce and bend starting with a piece of sheet metal.

The external conductor tracks can advantageously comprise sliding contacts that, together with potentiometer tracks of the electrical adjusting drive, make it possible to control the electrical adjusting drive.

The housing part can advantageously comprise recesses in which electrical elements such as thermal circuit breakers, interference-suppression chokes, capacitors, etc., are located, by way of which the electrical elements are more easily mounted on the housing part.

The internal conductor tracks advantageously form plug-in contacts for a connector, whereby the connector housing is advantageously formed integral with the housing part. This reduces the number of parts to be assembled.

The housing part comprises at least one mounting foot, with which the electrical adjusting drive can be attached to a mount, for example, when the housing part is joined with the electrical adjusting drive.

It is advantageous when the housing part comprises a brush holder designed integral with said housing part, because this eliminates the installation of an additional brush holder on the housing part or the motor housing of the electrical adjusting drive.

BRIEF DESCRIPTION OF THE DRAWINGS

Exemplary embodiments of the invention are shown in the drawing in simplified form and are described in greater detail in the subsequent description.

DETAILED DESCRIPTION OF THE PREFERRED EMBODIMENTS

Figure 1A:
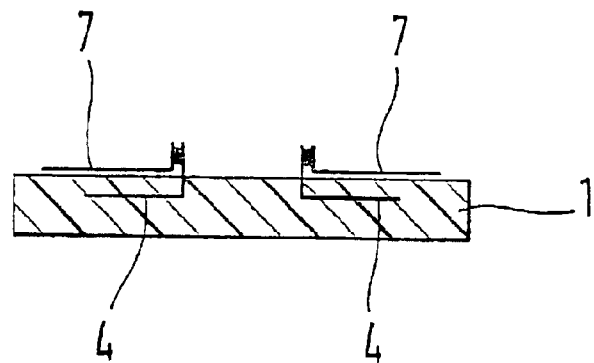
FIG. 1a shows a housing part, designed according to the invention, comprising internal and external conductor tracks.

FIG. 1a shows a partial view of a sectional drawing of a housing part 1, according to the invention, made of plastic, for example, in which at least one internal electrical conductor track 4 is at least partially located by means of a plastic coating applied by injection molding or casting around, for example.

The housing part 1 can be a cover or a base or an upper part or a lower part of a gearbox housing and/or a motor housing of an electrical adjusting drive, such as a windshield wiper drive or a power-window drive for motor vehicles, for example.

The internal conductor tracks 4 can be electrical cables. The conductor tracks 4 are preferably formed by a pressed screen, for example.

The internal conductor tracks 4 project at least partially out of the housing part 1 and are joined in electrically conductive fashion with at least one external conductor track 7 outside of the housing part 1, for example, whereby they do not represent terminal lugs of electrical components.

The external conductor tracks 7 are also formed by a pressed screen, for example, and are held on the housing part 1, e.g., by the electrical—and, therefore, mechanical as well—contacting on the internal conductor tracks 4 permanently enclosed in the housing part 1. Additionally, the housing part 1 can be joined with the external conductor tracks 7 by means of further fastening elements such as detent and clamp connections.

Figure 1B:
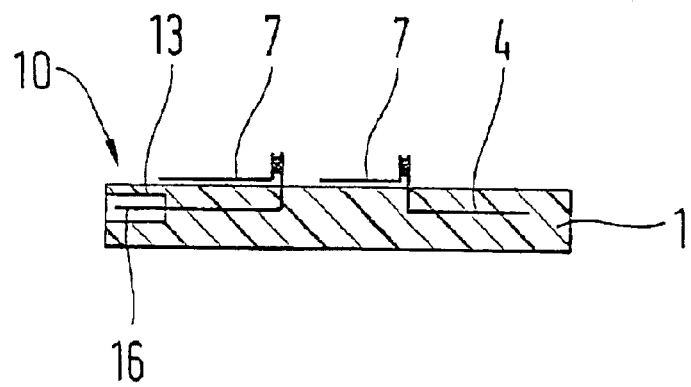
FIG. 1b shows a housing part designed according to the invention, according to FIG. 1a with a connector housing.

A connector 10 is formed by a part of the internal conductor track 4 that projects out of the housing part 1, i.e., the plug-in contacts 16, and a connector housing 13 formed as a part of the housing part 1 (FIG. 1b). The connector housing 13 can also be developed separate from the housing part 1, so that it can be adapted to customer-specific desires.

The connector 10 serves to connect to an external electrical power source that supplies the electrical elements located on the housing part 1 with electric current or voltage.

Figure 2:
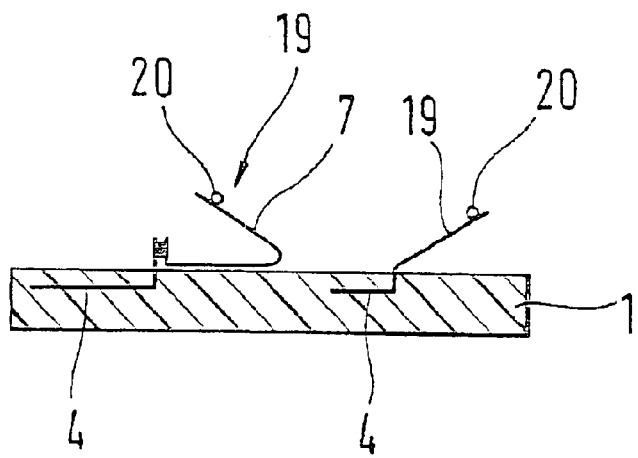
FIG. 2 shows a housing part designed according to the invention, according to FIG. 1a with sliding contacts.

FIG. 2 shows a part of a housing part 1 designed according to the invention, in the case of which one end of the external electrical conductor track 7 is bent by more than 90° out of its plane of attachment, so that it forms sliding contacts 19.

The sliding contacts 19 can also be formed by internal conductor tracks 4.

The sliding contacts 19 are designed with spring action, i.e., force must be used to press them toward the housing part 1 and, once the force is released, they spring back.

An electrical contact point 20 on the end of the sliding contact 19 forms the electrical contact with a not shown potentiometer track on another housing part. By means of electrical potentiometer tracks that are located in the electrical adjusting drive, e.g, in the gearbox housing, the electrical adjusting drive can be switched on and off, for example.

Copper, for example, is used as the material for the contact point 20, and said contact point is designed at least partially spherical in shape.

Figure 3:
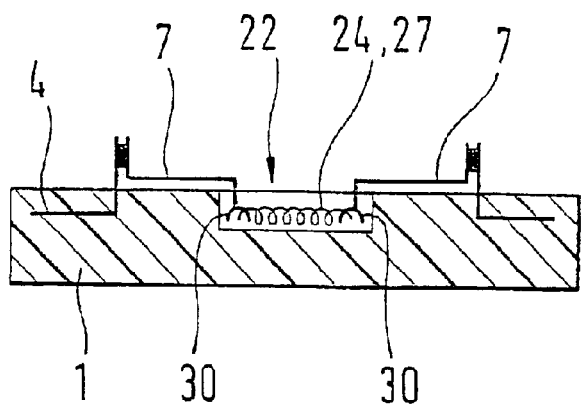
FIG. 3 shows the arrangement of electrical elements in recesses of a housing part designed according to the invention, and the electrical contacting of them by means of insulation piercing connecting devices.

FIG. 3 shows the arrangement of at least one electrical element 24 in at least one recess 22 of a housing part 1 designed according to the invention. An electrical interference-suppression choke 27, for example, as an electrical element 24, is located in a recess 22 of the housing part 1. The recess 22 is designed in such a fashion, for example, that the interference-suppression choke 27 fits tightly in it and is held in this fashion. The interference-suppression choke 27 can also be situated loosely in the recess 22, whereby a secure fastening to the housing part 1 takes place by means of the electrical and, therefore, the mechanical contact with the mechanically stiff external conductor tracks 7.

The interference-suppression choke 27 is joined at both ends with the ends of the external electrical conductor track 7 by means of "insulation piercing connecting devices" 30 or by soldering or welding. Capacitors to provide damping in the electric circuit and/or thermal circuit breakers for protection against overheating of the electrical elements 24 and yaw-rate sensors represent further electrical elements 24 that are located on the housing part 1, preferably in the recess 22.

Figure 4:
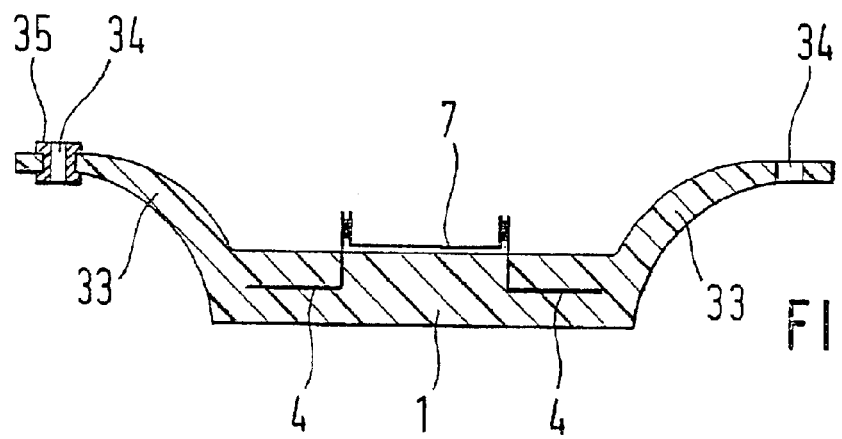
FIG. 4 shows a housing part designed according to the invention comprising mounting feet.

Mounting feet 33, for example, are required for installing the adjusting drive (not shown) (FIG. 4), in order fasten the adjusting drive to a wall, for example, an interior wall of a motor vehicle, for example. The mounting feet 33 are designed integral, for example, with the housing part 1 designed according to the invention. Two mounting feet 33 are used in this example. The mounting feet 33 can be adapted to specific customer requests. Mounting holes 34, for example, are provided on their ends, through which screws, for example, can be guided.

Additionally, a rubber ring 35 can be provided at the mounting hole 34 for damping the adjusting drive against the mounting wall.

Figure 5:
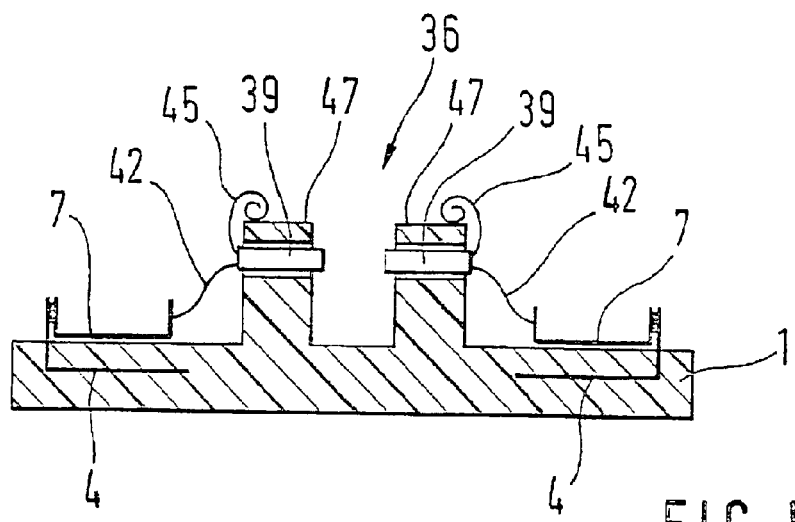
FIG. 5 shows a brush holder that is designed integral with the housing part designed according to the invention.

FIG. 5 shows a brush holder 36 that is designed integral, for example, with the housing part 1 according to FIGS. 1a, 1b, 2, 3, 4 and designed according to the invention. The brush holder 36 is composed of at least one brush 39 that bears against a commutator (not shown) of an electric motor of the electrical drive unit. The brush 39 is pressed against the commutator by means of a spring 45. The electrical power supply takes place via the external connector 10, plug-in contacts 16, internal conductor tracks 4, external conductor tracks 7, which, in turn, are then electrically connected with the brush 39 by means of brush leads 42.

Figure 6:
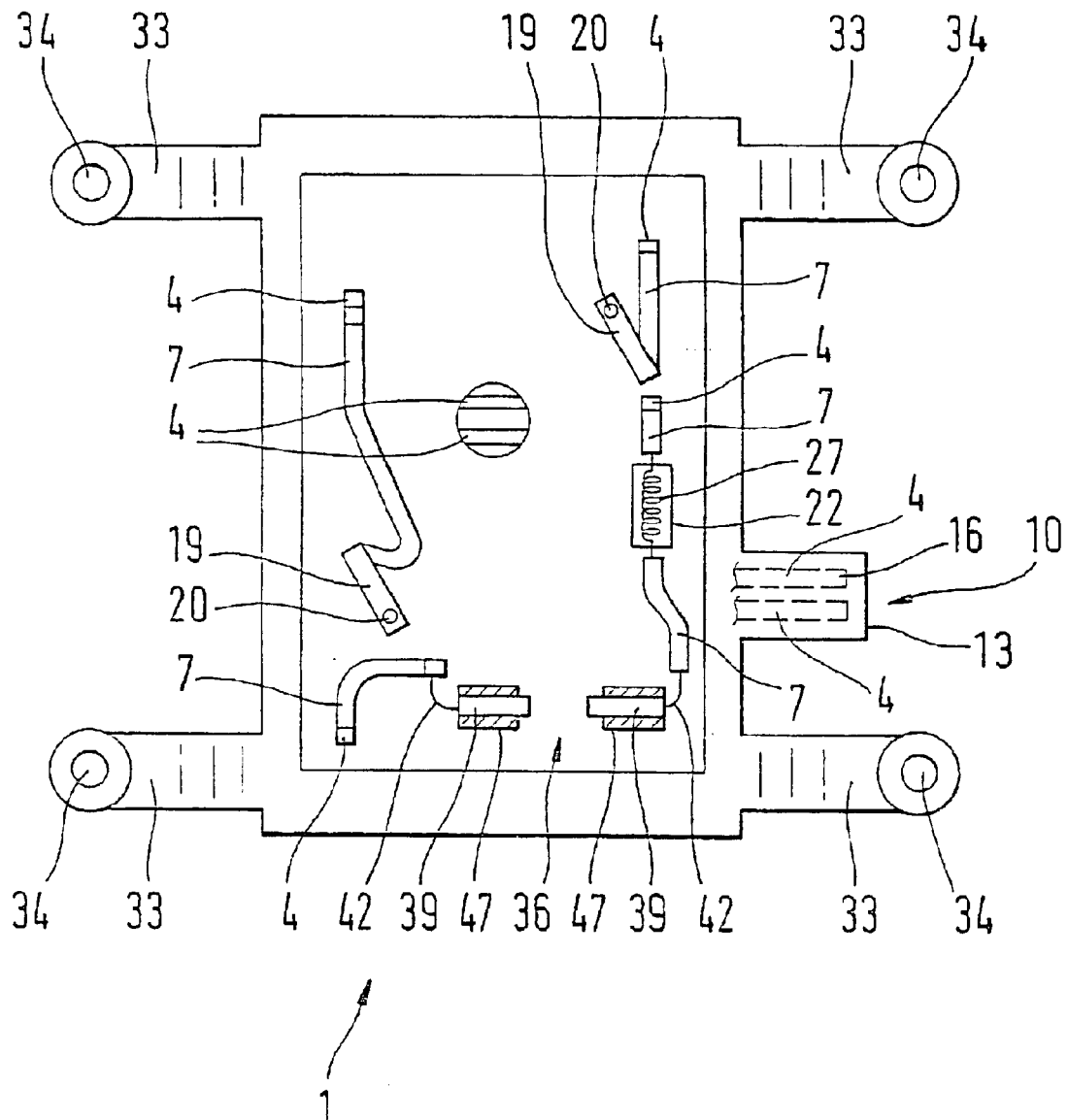
FIG. 6 shows an exemplary embodiment of a housing part designed according to the invention.

FIG. 6 shows a top view of a housing part 1 designed according to the invention having the parts shown in FIGS. 1a, 1b and 2 through 5.

The sliding contacts 19 are connected with the internal conductor tracks 4 in electrically conductive fashion, which said internal conductor tracks extend inside the housing part 1 up to the connector housing 13 (shown as dashed lines in the connector housing 13). There they are connected with control electronics via an external connector (not shown). The control electronics can also be located on the gearbox housing part 1. The brush holder 36 is formed by two high spots 47, for example, into which the brushes 39 are guided.

What is claimed is:

1. A housing part for an electrical adjusting drive that at least partially encloses an electrical internal conductor track,
   wherein at least one electrical external conductor track (7) is located on the housing part (1), and
   at least one electrical external conductor track (7) is electrically contacted with the at least one internal conductor track (4), wherein the at least one external conductor track (7) has at least one sliding contact (19).

2. The housing part according to claim 1, wherein the at least one internal conductor track (4) is designed as a pressed screen.

3. The housing part according to claim 1, wherein the at least one external conductor track (7) is designed as a pressed screen.

4. The housing part according to claim 1, wherein the housing part (1) has at least one mounting foot (33).

5. The housing part according to claim 1, wherein a brush holder (36) is designed integral with the housing part (1).

6. The housing part according to claim 1 or 3, wherein the at least one external conductor track (7) has insulation piercing connecting devices for electrical contacting.

7. The housing part according to claim 1, wherein the housing part (1) is a gearbox housing cover.

8. The housing part according to claim 1, wherein the housing part (1) is a gearbox housing base.

9. The housing part according to claim 1, wherein the housing part (1) is a housing part of a gearbox housing of the electrical adjusting drive.

10. The housing part according to claim 1, wherein the at least one internal conductor track (4) comprises a plastic coating applied by injection molding.

11. A housing part for an electrical adjusting drive that at least partially encloses an electrical internal conductor track,
    wherein at least one electrical external conductor track (7) is located on the housing part (1), and
    at least one electrical external conductor track (7) is electrically contacted with the at least one internal conductor track (4), wherein the housing part (1) has at least one recess (22) in which at least one electrical element (24) is located.

12. The housing part according to claim 11, wherein the electrical element (24) is an interference suppression choke (27).

13. The housing part according to claim 11, wherein the electrical element (24) is a thermal circuit breaker.

14. A housing part for an electrical adjusting drive that at least partially encloses an electrical internal conductor track,
    wherein at least one electrical external conductor track (7) is located on the housing part (1), and
    at least one electrical external conductor track (7) is electrically contacted with the at least one internal conductor track (4), wherein a connector housing (13) is located on the housing part (1).

15. The housing part according to claim 14, wherein the connector housing (13) is designed integral with the housing part (1).

16. The housing part according to claim 14 or 15, wherein the internal conductor tracks (4) with the connector housing (13) form a connector (10).

* * * * *